United States Patent
Iga

(10) Patent No.: US 7,301,275 B2
(45) Date of Patent: *Nov. 27, 2007

(54) ORGANIC EL DISPLAY DEVICE INCLUDING A STEP ALLEVIATION IN LIGHT EMITTING AREA

(75) Inventor: Daisuke Iga, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/002,662

(22) Filed: Dec. 3, 2004

(65) Prior Publication Data

US 2005/0099117 A1    May 12, 2005

Related U.S. Application Data

(63) Continuation of application No. 10/361,616, filed on Feb. 11, 2003, now Pat. No. 6,836,069.

(30) Foreign Application Priority Data

Feb. 12, 2002    (JP)    ............... 2002-034180

(51) Int. Cl.
*H01L 51/00*    (2006.01)
(52) U.S. Cl. ............. 313/504; 313/506; 313/500
(58) Field of Classification Search ........ 313/504–506, 313/512, 500; 315/169.3
See application file for complete search history.

(56) References Cited

U.S. PATENT DOCUMENTS

| | | | |
|---|---|---|---|
| 5,684,365 A | 11/1997 | Tang et al. | 315/169.3 |
| 6,147,451 A | 11/2000 | Shibata et al. | 313/506 |
| 6,246,179 B1 * | 6/2001 | Yamada | 315/169.3 |
| 6,501,227 B1 | 12/2002 | Koyama | 315/169.3 |
| 6,590,346 B1 | 7/2003 | Hardley et al. | 315/169.3 |
| 6,597,121 B2 | 7/2003 | Imura | 315/169.3 |
| 6,665,044 B1 | 12/2003 | Jacobsen et al. | 349/187 |
| 6,774,574 B1 * | 8/2004 | Koyama | 315/169.3 |
| 6,836,069 B2 * | 12/2004 | Iga | 313/506 |
| 2002/0047120 A1 | 4/2002 | Inukai | 257/59 |
| 2003/0227253 A1 * | 12/2003 | Seo et al. | 313/504 |

FOREIGN PATENT DOCUMENTS

| | | | |
|---|---|---|---|
| JP | 2000164875 A | * | 6/2000 |
| JP | 2000-340359 | | 12/2000 |
| JP | 2001-043981 | | 2/2001 |
| JP | 2002-025781 | | 1/2002 |

* cited by examiner

*Primary Examiner*—Karabi Guharay
(74) *Attorney, Agent, or Firm*—H.C. Park & Associates, PLC

(57) ABSTRACT

An organic electroluminescence (EL) display unit includes a plurality of pixels formed on a glass substrate and each including a TFT area and a luminescence area. An edge cover film covers the TFT area and exposes the luminescence area through a window formed in the edge cover film. The edge of the edge cover film adjacent to the window has a taper angle equal to or smaller than 30 degrees. This taper angle is obtained by a post-baking treatment in addition to a step alleviating film formed in the luminescence area to underlie the organic EL element.

9 Claims, 14 Drawing Sheets

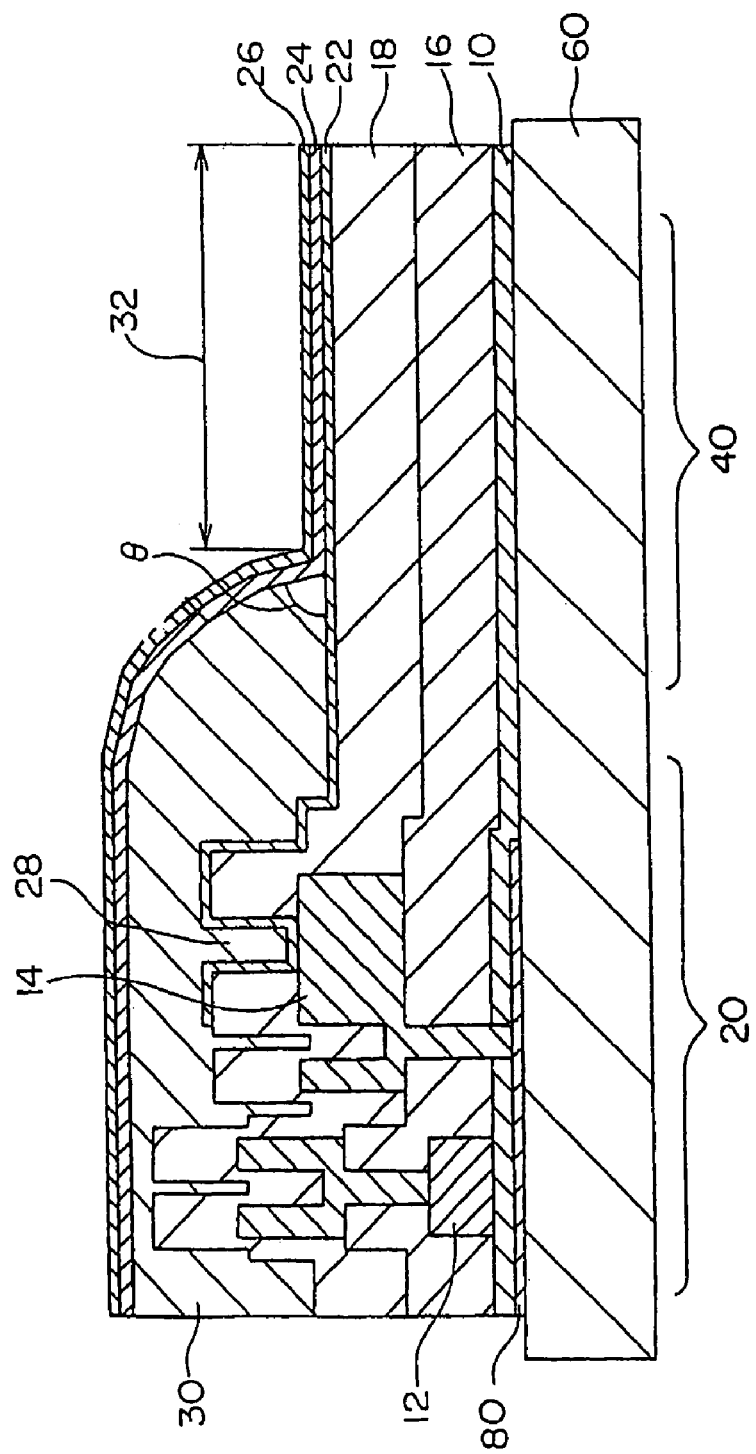

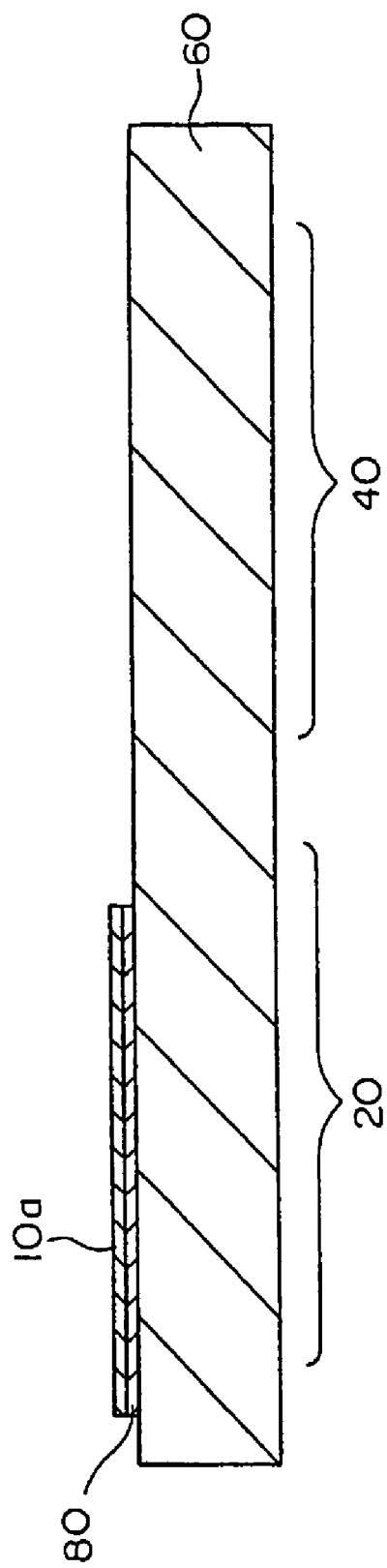

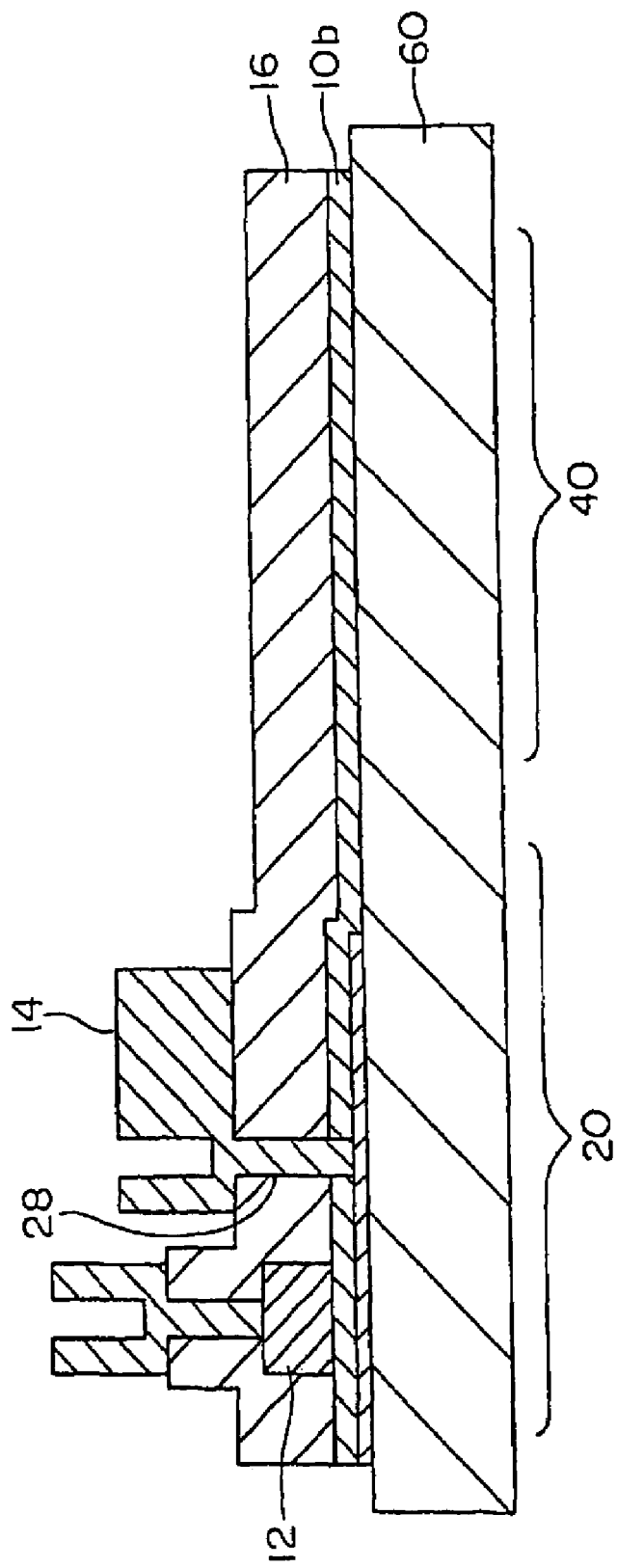

ORGANIC EL DISPLAY DEVICE INCLUDING A STEP ALLEVIATION IN LIGHT EMITTING AREA

CROSS REFERENCE TO PRIOR APPLICATION

This application is a continuation application from U.S. patent application Ser. No. 10/361,616, filed Feb. 11, 2003, now U.S. Pat. No. 6,836,069 which claims priority to and the benefit of Japanese Patent Application No. 2002-034180, filed on Feb. 12, 2002, which are all hereby incorporated by reference for all purposes as if fully set forth herein.

BACKGROUND OF THE INVENTION (a) Field of the Invention

The present invention relates to an organic EL (electroluminescence) display unit and, more particularly, to an active-matrix organic EL display unit including a TFT (thin-film transistor) area and a luminescence area receiving therein an organic EL element.

(b) Description of the Related Art

An organic EL device emits light with a spontaneous electroluminescence function wherein positive holes injected from an anode and electrons injected from a cathode are recombined in an organic El film by applying an electric field to the organic EL film. The recombination energy generated by the recombination allows a fluorescent substance or phosphor in the organic EL film to generate electroluminescence. Examples of an organic EL display unit having such an organic EL device include an active-matrix organic EL display unit, wherein a plurality of pixel elements are arranged in a matrix on a glass substrate. Each pixel element includes a TFT area receiving therein a TFT and a luminescence area receiving therein an organic EL element driven by the associated TFT which functions as an active element.

FIG. 13 shows in a sectional view an example of a single pixel of the active-matrix organic EL display unit. The pixel element includes a TFT 20 and an associated organic EL element 40 both formed on a transparent insulator substrate (not shown). The TFT 20 includes source/drain regions formed in a p-type amorphous silicon layer 80, formed on the transparent insulator substrate with an intervention of a $SiO_2$ underlying layer 60, a gate insulation film 10, and a gate electrode 12 connected to an aluminum electrode 14. The TFT area is covered by an edge cover film 30 made of resin. The luminescence area receiving therein the organic EL element 40 include an organic planarizing film 21 formed on the underlying $SiO_2$ film 60 with an intervention of the gate insulation film 10 and inter-layer dielectric films 16 and 18, and a transparent electrode 22, an organic EL film 24 and an aluminum cathode 26, which are consecutively formed on the organic planarizing film 21.

The organic planarizing film 21 is used to alleviate the irregularity on the top surface of the interlayer dielectric film 18. The transparent electrode 22 formed on the organic planarizing film 21 is connected to the TFT 20 via a contact plug 28. The edge cover film 30, which alleviates the irregularity on the surface of the transparent electrode 22 has a window 32 whereat a junction is formed between the organic EL film 24 and the transparent electrode 22. The aluminum cathode 26 covers the entire surface of the organic EL display unit as a topmost layer. The edge cover film 30 is subjected to a tapering processing at the edge thereof adjacent to the window 32 formed in the edge cover film 30 for exposing the luminescence area. The taper processing protects the organic EL film 24 against a crack at the edge 34 of the window 32, thereby preventing a short-circuit failure between the transparent electrode 22 and the aluminum cathode 16.

In the conventional active-matrix organic EL display unit shown in FIG. 13, the organic planarizing film 21 is formed for planarization after the TFTs 20 are formed on the glass substrate. In addition, the tapering processing is conducted for planarization of the irregularity on the top of the TFT 20 caused by the thickness of the transparent electrode 22 after the transparent electrode 22 and the contact plug of the aluminum electrode 14 are formed. This process is conducted for prevention of the aluminum cathode 26 from being damaged or broken at the step difference and for prevention of a short-circuit failure between the transparent electrode 22 and the aluminum cathode 26 caused by the thinner structure of the organic EL film 24.

The conventional active-matrix organic EL display unit shown in FIG. 13 has a drawback wherein degassing from the organic planarization film 21 degrades the organic EL film 24. In fabrication of the organic EL display unit, a wet processing conducted after forming the contact plug of the transparent electrode 22 causes moisture absorption in the organic planarizing film 21, which later discharges the moisture therefrom and degrades the organic EL film 24.

In order to solve the above problem in the conventional organic EL display unit, it may be considered to merely omit the organic planarizing film 21. However, the omission of the organic planarizing film 21, as shown in FIG. 14, necessitates a larger thickness of the edge cover film 30 for planarizing the surface of the TFT area. The larger thickness generates a larger step difference between the TFT area and the luminescence area, and a larger taper angle θ at the edge of the edge cover film 30 near the window 32, which causes a short-circuit failure between the transparent electrode 22 and the aluminum cathode 26. Thus, omission of the organic planarizing film should not be employed.

In view of the above problem in the conventional organic EL display unit, it is an object of the present invention to provide an active-matrix organic EL display unit which is capable of solving the degassing problem to prevent degradation of the organic EL film and preventing a short-circuit failure between the transparent electrode and the aluminum cathode in the vicinity of the edge of the edge cover film.

The present invention provides an organic electroluminescence (EL) display unit including: a transparent insulator substrate; and a plurality of pixels formed thereon and each including a TFT area and a luminescence area, the TFT area receiving therein a TFT and including an edge cover film covering the TFT, the luminescence area having an organic EL element and a window formed in the edge cover film for exposing therefrom the organic EL element, an edge of the edge cover film adjacent to the window having a taper angle equal to or smaller than 30 degrees.

In accordance with the organic EL display unit of the present invention, the smaller taper angle equal to or smaller than 30 degrees prevents a short-circuit failure between electrodes of the organic EL element without degrading the organic EL film. The smaller taper angle may be obtained by a step alleviating film formed in the luminescence area and/or a tapering processing for the edge of the edge cover film as by using a post-baking treatment.

The above and other objects, features and advantages of the present invention will be more apparent from the following description, referring to the accompanying drawings.

BRIEF DESCRIPTION OF THE DRAWINGS

FIG. 8 is a sectional view of an organic EL display unit according to a third embodiment of the present invention.

FIG. 9 is a sectional view showing a fabrication step of the organic EL display unit of FIG. 8.

FIG. 10 is a sectional view showing subsequent fabrication step of the organic EL display unit of FIG. 8.

PREFERRED EMBODIMENTS OF THE INVENTION

Figure 1:
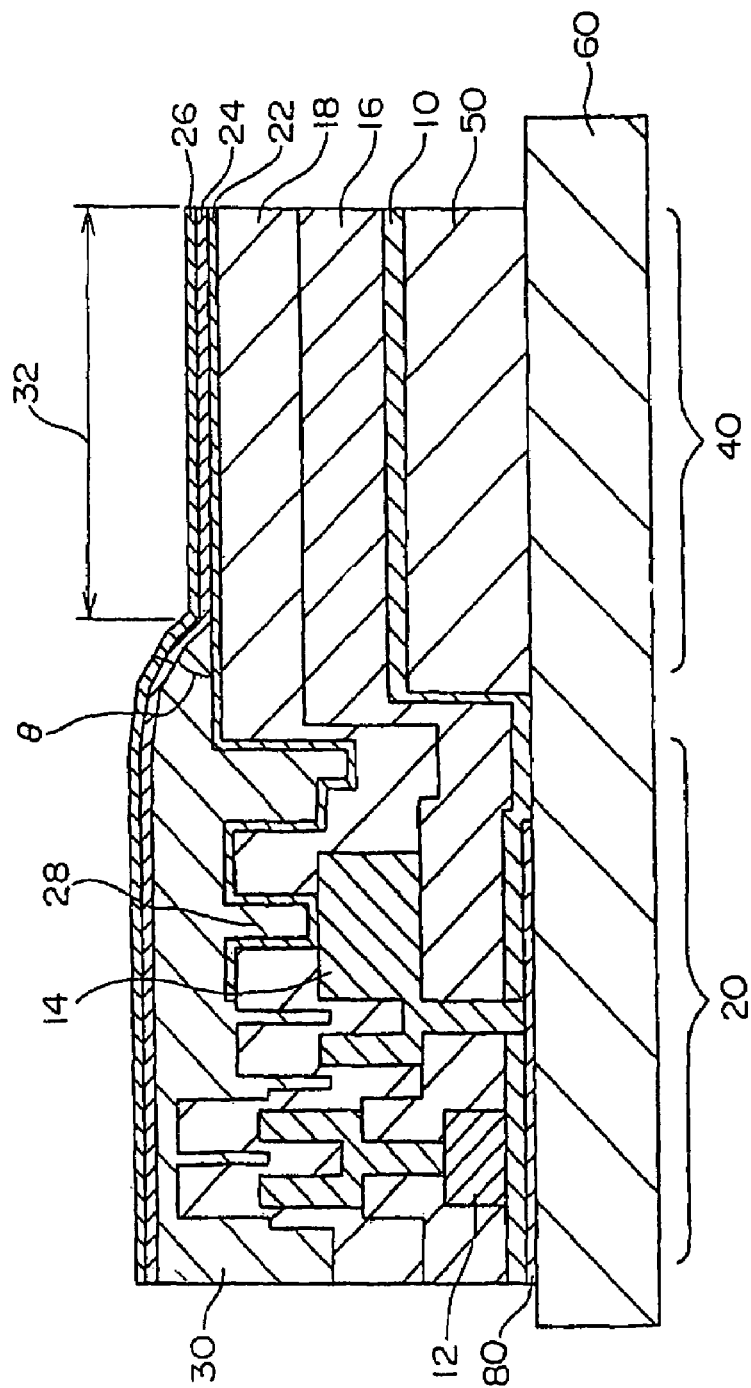
FIG. 1 is a sectional view of a single pixel of an organic EL display unit according to a first embodiment of the present invention.

Now, the present invention is more specifically described with reference to accompanying drawings, wherein similar constituent elements are designated by similar reference numerals.

Referring to FIG. 1, there is shown a single pixel element of an organic EL display unit according to a first embodiment of the present invention. The display unit includes a plurality of TFT's 20 and an area 40 for a plurality of associated organic EL elements formed on a $SiO_2$ underlying film 60, which is deposited on a glass substrate (or transparent insulator substrate) not specifically depicted in the figure. The $SiO_2$ underlying film 60 has a function for preventing contaminants, such as alkali metals, heavy metals and carbon, from diffusing from the glass substrate during a high-temperature procedure in the fabrication process.

Figure 2:
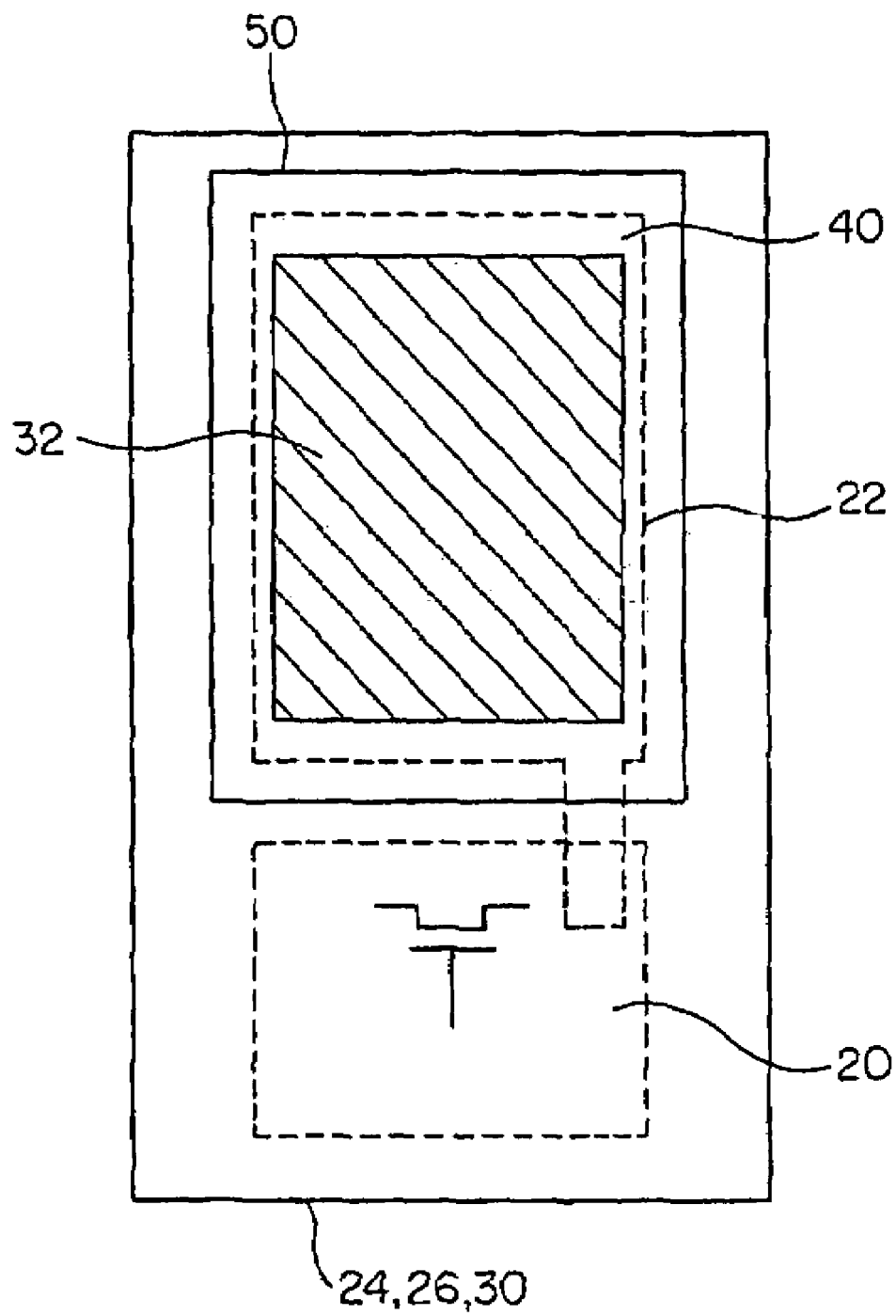
FIG. 2 is a top plan view of the pixel of the organic EL display unit of FIG. 1.

The TFT 20 includes source/drain regions formed in a p-type amorphous silicon (a-Si) film 80, which is formed on the $SiO_2$ underlying film 60, a gate insulation film 10 formed on the a-Si film 80, and a gate electrode 12 formed thereon and connected to an aluminum electrode 14. The TFT 20 is covered by an edge cover film 30 made of resin. The area for the organic EL element 40, i.e., electroluminescence area includes a step alleviation film 50, and the gate insulation film 10, inter-layer dielectric films 16 and 18, a transparent electrode film 22, an organic EL film 24 and an aluminum cathode 26, which are consecutively formed on the $SiO_2$ underlying film 60. The step alleviation film 50 made of inorganic substance, such as $SiO_2$ or SiN, is formed in the area for the organic EL element 40 on the underlying film 60. The step alleviation film 50 has an area somewhat larger than the area for the organic EL element 40, as shown in FIG. 2 showing the top plan view of the pixel area of the organic display unit shown in FIG. 1.

Figure 3:
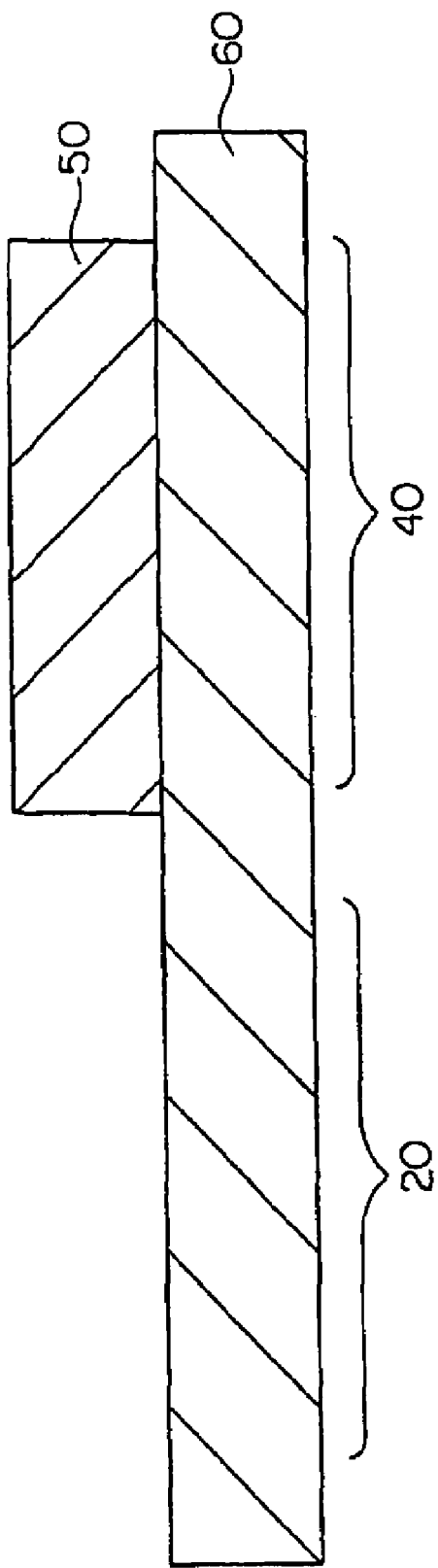
FIG. 3 is a sectional view showing a fabrication step of the organic EL display unit of FIG. 1.
Figure 4:
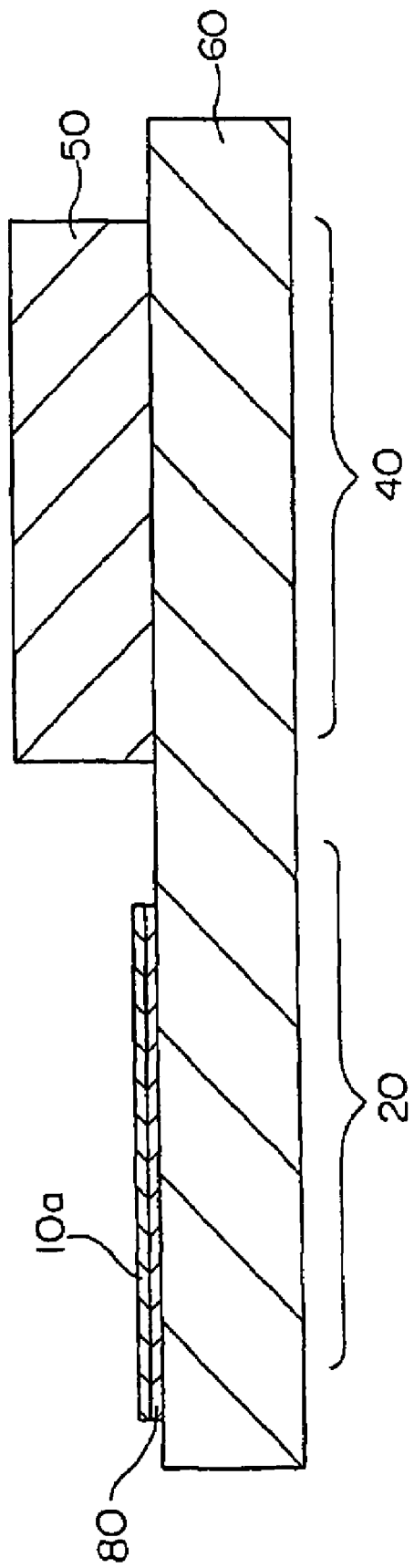
FIG. 4 is a sectional view showing subsequent fabrication step of the organic EL display unit of FIG. 1.

FIGS. 3 to 6 show consecutive fabrication steps for the organic EL display unit of FIG. 1. First, a $SiO_2$ underlying film 60 having a function for prevention of diffusion of contaminants is formed on a glass substrate not shown, followed by deposition of a $SiO_2$ (or SiN) film thereon. The $SiO_2$ film is then subjected to patterning to leave the step alleviation film 50 in the luminescence area, as shown in FIG. 3. The patterning may be performed by using a photolithographic and dry etching technique.

A p-type silicon film is then deposited by CVD on the entire surface, followed by annealing thereof to form a p-type amorphous silicon (a-Si) film. Subsequently, a first gate insulation film 10a made of $SiO_2$ is formed on the a-Si film, and patterned together with the p-type a-Si film by using a photolithographic and dry etching technique to leave the first gate insulation film 10a and the p-type a-Sif film in the area for the TFT 20. The first gate insulation film 10a has a thickness of about 10 nm. N-type impurity ions are then introduced to the p-type a-Si film 80 through the first gate insulation film 10a to form source/drain regions in the p-type a-Si film 80.

Figure 5:
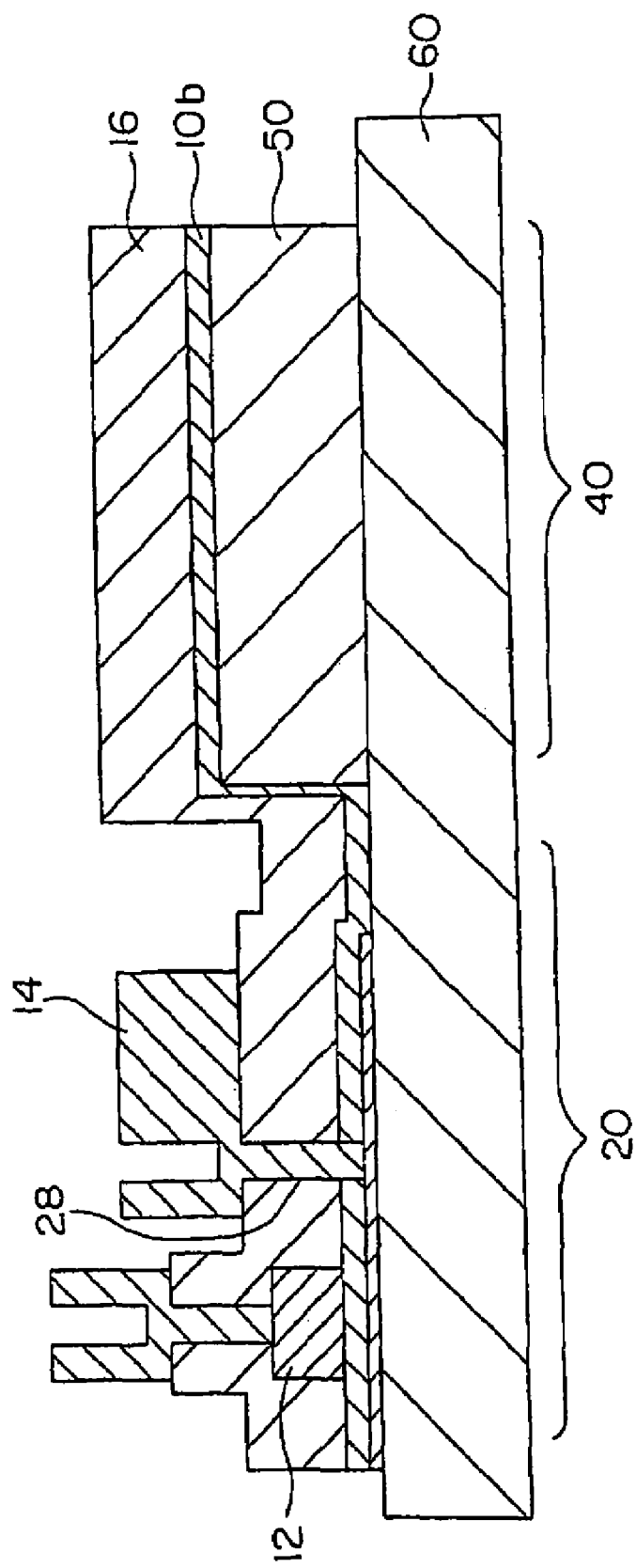
FIG. 5 is a sectional view showing subsequent fabrication step of the organic EL display unit of FIG. 1.

Subsequently, a second gate insulation film 10b having a thickness of about 90 nm is deposited thereon by CVD of $SiO_2$. P-type impurity ions are then introduced in the channel area of the TFT 20 through the first and second gate insulation films 10a and 10b. A gate electrode film is then deposited and patterned by using a photolithographic and dry etching technique to form a gate electrode 12 on the gate insulation film 10b. Thereafter, a first inter-layer dielectric film 16 is deposited and patterned to form therein a through-hole 28. An aluminum film is then deposited and patterned to form an aluminum electrode 14, as shown in FIG. 5. It is to be noted that the two-layer structure of the gate insulation film 10 is used therein for separately introducing n-type impurity ions and p-type impurity ions, deposition of the former through a thick insulator film being in general difficult. If the gate insulation film 10 has a lower thickness, such as a thickness of about 50 nm or below, the gate insulation film 10 may be formed in a single layer.

Figure 6:
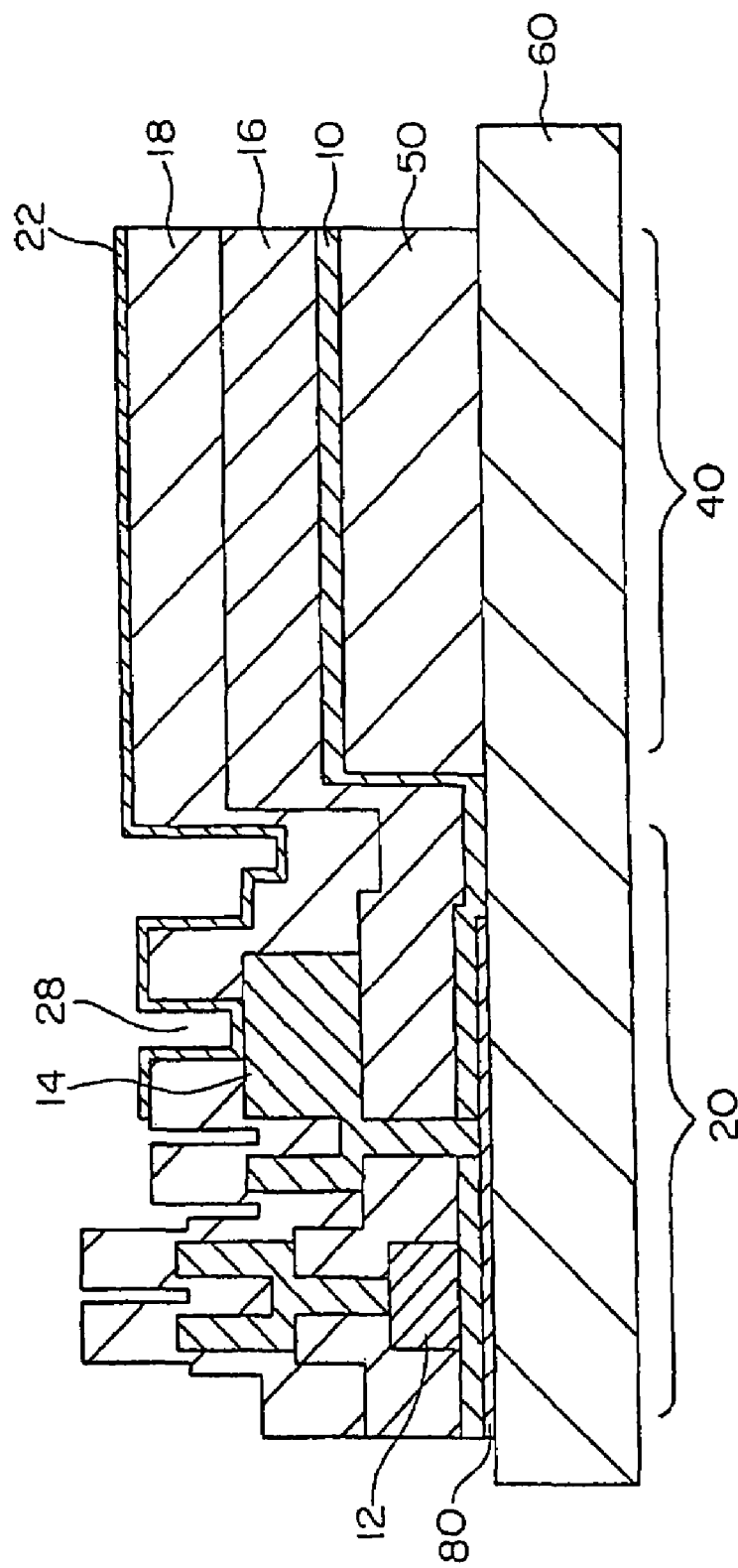
FIG. 6 is a sectional view showing subsequent fabrication step of the organic EL display unit of FIG. 1.

A second inter-layer dielectric film 18 is then deposited by CVD and patterned by a photolithographic and dry etching technique to form therein a through-hole 28. Then, an ITO (indium-tin-oxide) electrode is formed by sputtering and patterned by a photolithographic and dry etching technique to form a transparent electrode 22, as shown in FIG. 6.

An edge cover film 30 is then formed over the entire surface by using a spin-coating technique, and patterned by photolithographic and dry etching technique to form a window 32 for exposing therefrom the organic EL element 40. The edge cover film 30 is then subjected to post-baking treatment to be patterned to have a taper angle of 30 degrees or smaller at the edge thereof adjacent to the window 32. Thereafter, an organic EL film 24 and an aluminum cathode film 26 are formed by evaporation, as shown in FIGS. 1 and 2.

The organic EL display unit of the present embodiment includes the step alleviation film 50 in the area for the organic EL element 40, the step alleviation film 50 having a thickness corresponding to the step difference between the area for the TFT 20 and the area for the organic EL element 40 in the resultant organic EL display unit. After the coating by the edge cover film 30, the step difference between the area for the TFT 20 and the area for the organic EL element 40 is made substantially zero due to the function of the step alleviation film 50.

The substantial equal height between the TFT area and the luminescence area provides 20 degrees or lower for the taper angle of the edge of the edge cover film 30 adjacent to the window 32 for the luminescence area. This angle prevents a defective step coverage of the organic EL film 24 at the edge of the window 32, and a resultant short-circuit failure between the aluminum cathode 26 and the transparent electrode 22. The taper angle may be 30 degrees or below.

Figure 12A:
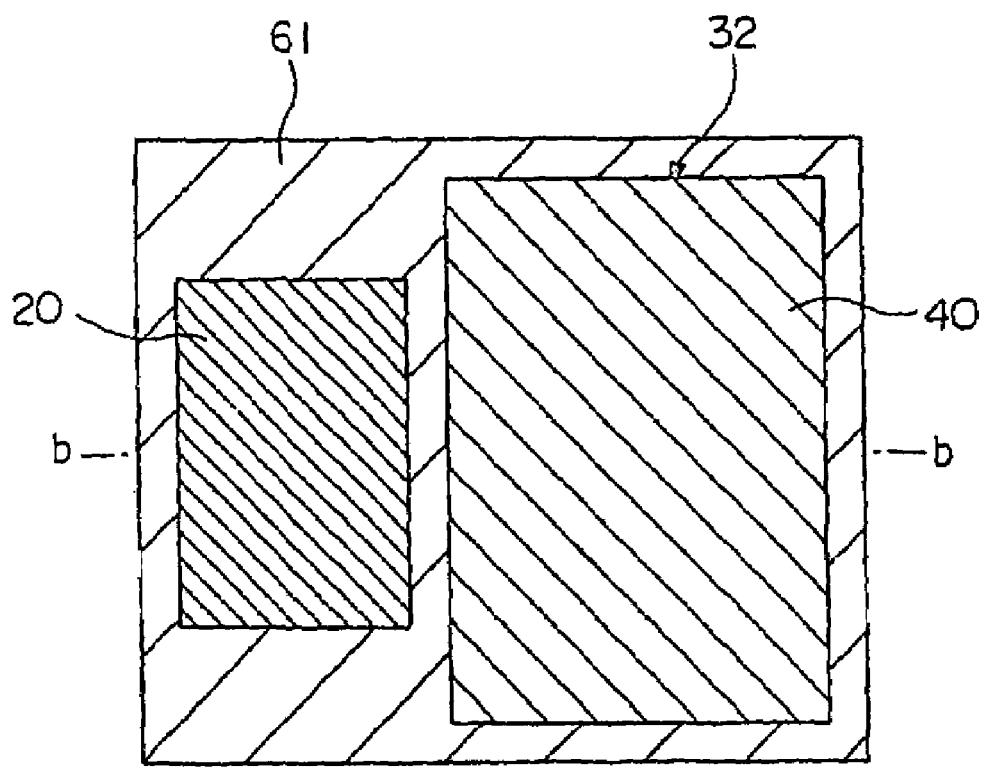
FIG. 12A is a top plan view of a comparative example of the organic EL display unit of the present invention.
Figure 12B:
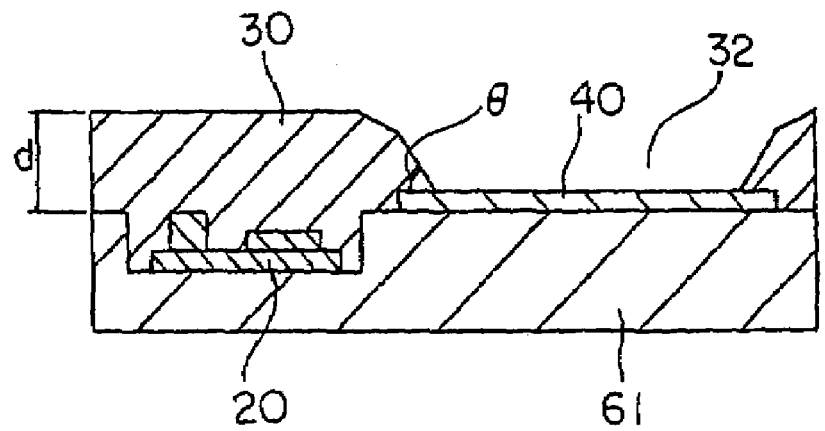
FIG. 12B is a sectional view taken along line b-b in FIG. 12A.
Figure 13:
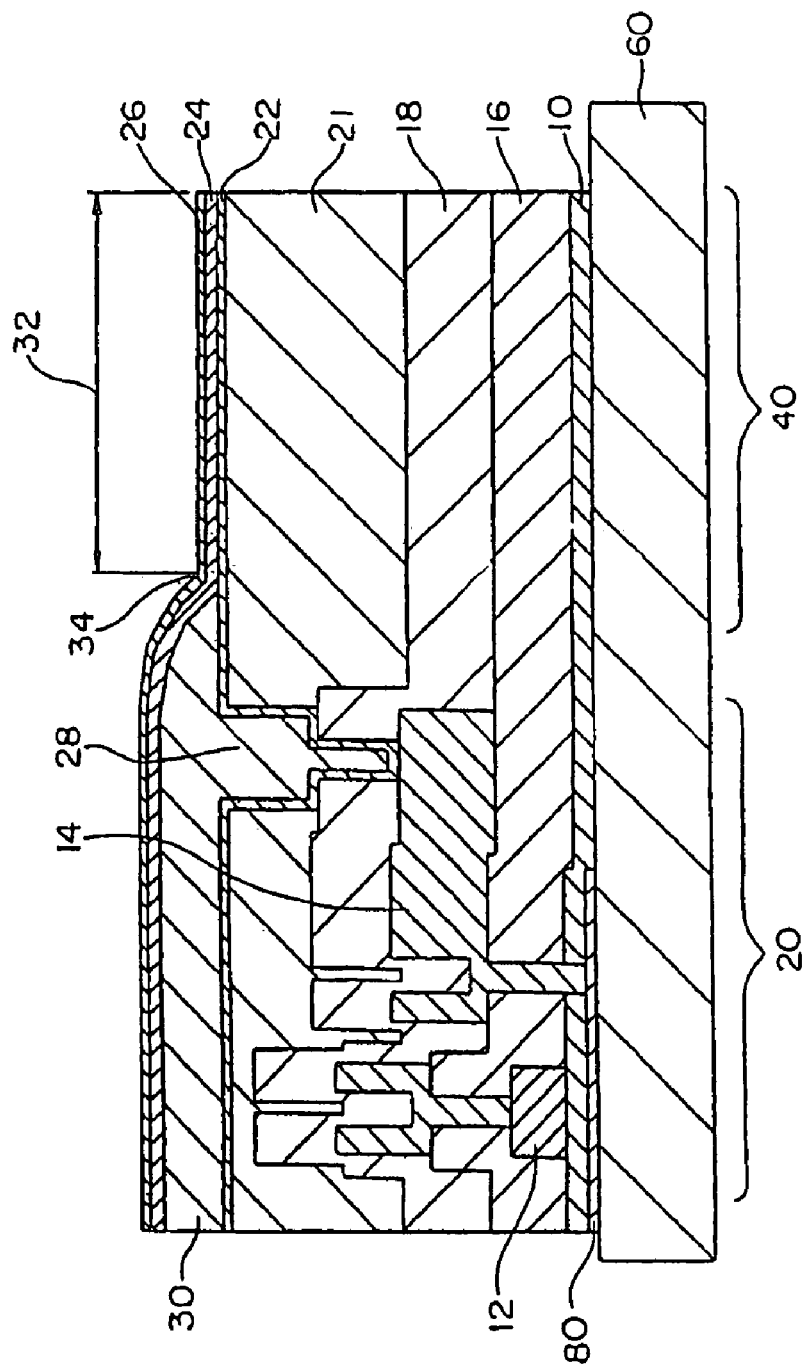
FIG. 13 is a sectional view of a conventional active-matrix organic EL display unit.
Figure 14:
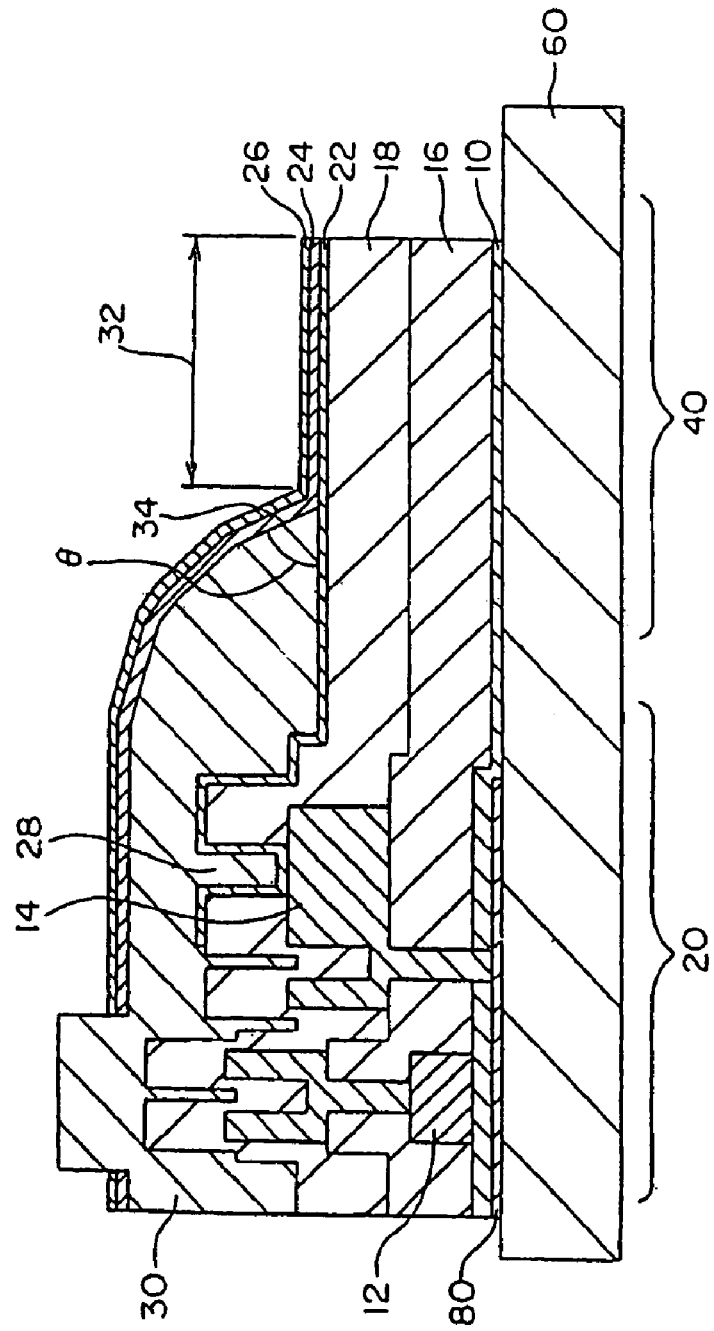
FIG. 14 is a sectional view of a modification of the active-matrix organic EL display unit of FIG. 13, wherein an organic planarizing film is omitted.

It may be considered to employ another structure for alleviating the step difference between the TFT area and the luminescence area by using a counter sinking technique to form a trench and lower the thickness of the glass substrate in the TFT area. This structure is shown in FIGS. 12A and 12B as a comparative example, wherein the glass substrate 61 is lowered in the TFT area to embed the TFT 20 to equalize the height of the TFT area and the luminescence area in the resultant organic EL display unit. The counter sinking process is effective for equalizing the heights of both the areas; however, the counter sinking process is more complicated and thus is inferior to the structure of the first embodiment.

Figure 7A:
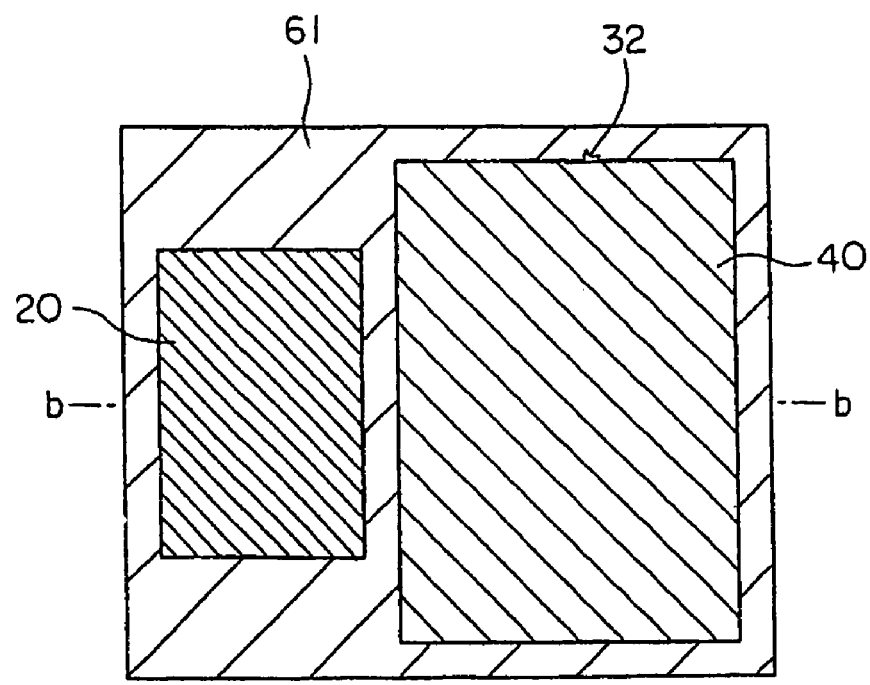
FIG. 7A is a top plan view of an organic EL display unit according to a second embodiment of the present invention.
Figure 7B:
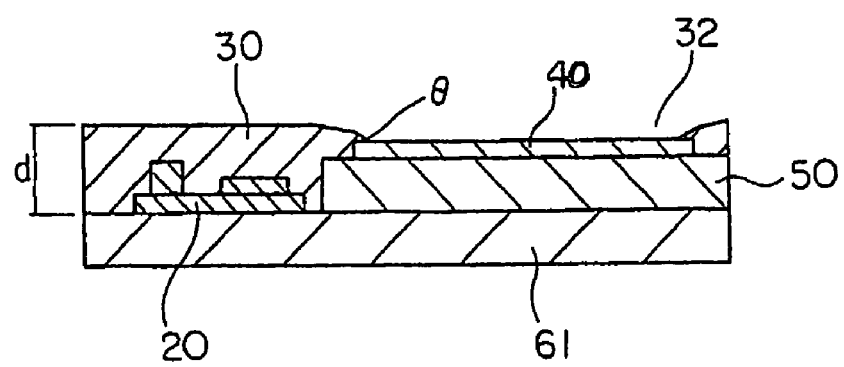
FIG. 7B is a sectional view taken along line b-b in FIG. 7A.

Referring to FIGS. 7A and 7B, there is shown a second embodiment of the present invention, wherein the step alleviating film 50 is formed directly on the glass substrate 61 for equalizing the heights of both the areas. The other configurations are similar to those in the first embodiment. Comparing the structure of the present embodiment shown in FIGS. 7A and 7B against the structure of the comparative example shown in FIGS. 12A and 12B, the step difference between the edge cover film 30 covering the TFT area and the top of the luminescence area is smaller in the structure of FIGS. 7A and 7B than in the structure of FIGS. 12A and 12B, assuming that the edge cover film 30 is formed to a specified thick in both the structures of FIGS. 7A and 7B and FIGS. 12A and 12B. This allows the taper angle θ of the edge of the edge cover film 30 to be smaller in FIG. 7B than in FIG. 12B and thus the structure of FIGS. 7A and 7B is advantageous. It is to be noted that the edge cover film 30 is not depicted in FIGS. 7A and 12A.

Referring to FIG. 8, an organic EL display unit according to a third embodiment of the present invention has a structure wherein the taper angle θ of 30 degrees or smaller for the edge of the edge cover film 30 is obtained without using the step alleviating film 50 employed in the first and second embodiments. Although the taper angle θ is depicted as if larger than 30 degrees in FIG. 8 due to the convenience of depiction, the taper angle θ in this embodiment is in fact smaller than 30 degrees. The structure of FIG. 8 is similar to the structure of FIG. 1 except for the absence of the step alleviating film 50 in the present embodiment.

In the third embodiment, the taper angle θ smaller than 30 degrees is obtained by a taper processing of the edge of the edge cover film by using a post-baking treatment, as will be described in the fabrication process for the structure of FIG. 8. The taper angle θ equal to or smaller than 30 degrees prevents a short-circuit failure between the transparent electrode 22 and the aluminum cathode 26.

Figure 11:
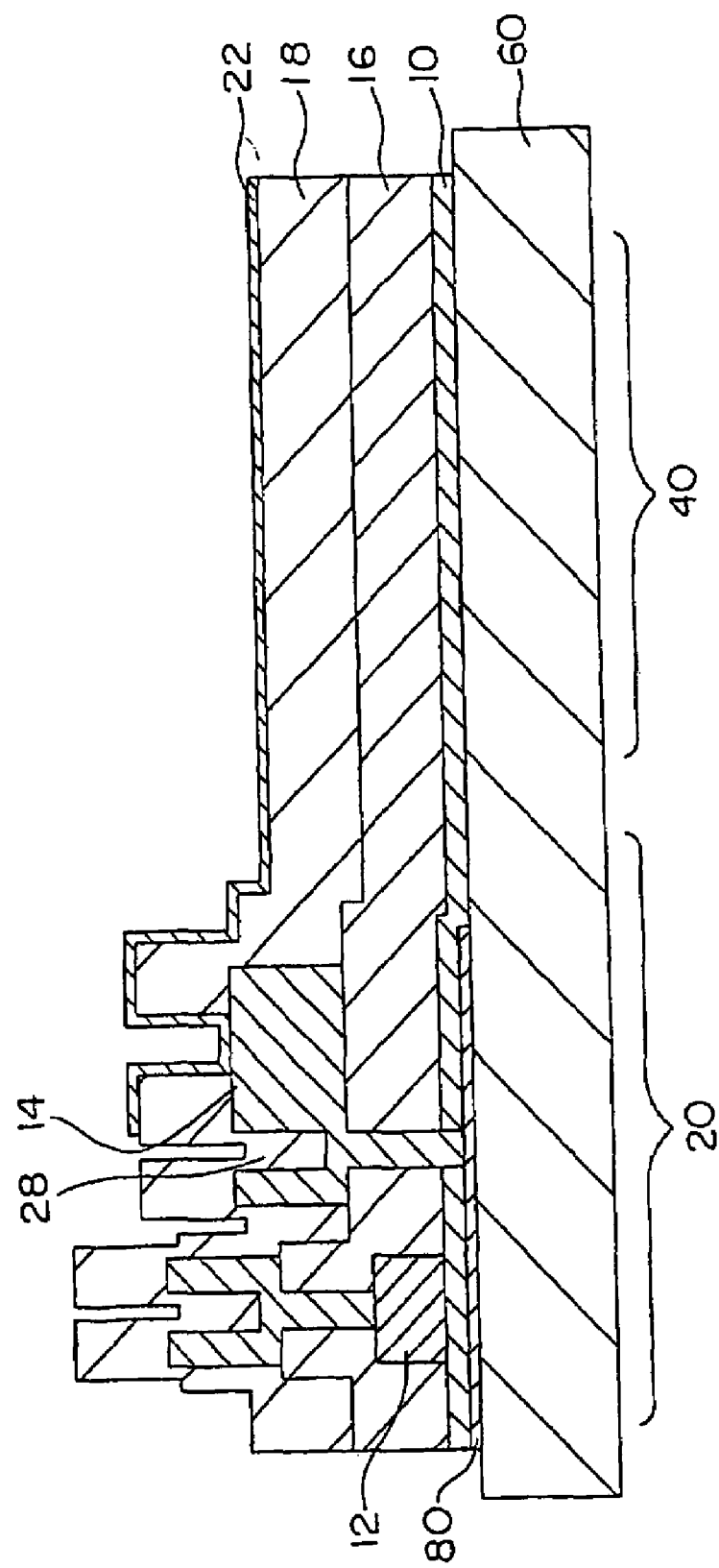
FIG. 11 is a sectional view showing subsequent fabrication step of the organic EL display unit of FIG. 8.

FIGS. 9 to 11 show the consecutive steps for fabrication of the organic EL display unit of the present embodiment. First, a $SiO_2$ underlying film 60 is deposited on a glass substrate not shown for preventing diffusion of contaminants. Subsequently, a silicon film is deposited thereon by CVD and annealed to form a p-type a-Si film 80. A first gate insulation film 10a made of $SiO_2$ is then deposited and patterned together with the p-type a-Si film to leave the a-Si film 80 and the gate insulation film 10a in the TFT area, as shown in FIG. 9.

A second gate insulation film 10b is then deposited over the entire surface, followed by deposition and patterning of a gate electrode film to form a gate electrode 12. A fist inter-layer dielectric film 16 is then deposited thereon, followed by patterning thereof to form a through-hole 28 therein. An aluminum electrode 14 is then formed including the interior of the through-hole 28, as shown in FIG. 10.

A second inter-layer dielectric film 18 is then deposited, followed by patterning thereof to form therein through-hole 28. An ITO film is then deposited thereon and patterned to form a transparent electrode 22, as shown in FIG. 11.

An edge cover film 30 is then formed by a spin-coating technique, and patterned to form therein a window 32 for exposing the luminescence area. The edge of the edge cover film 30 is then subjected to a post-baking treatment to form the taper having a taper angle smaller than 30 degrees. Subsequently, an organic EL film 24 and an aluminum cathode 26 are deposited, as shown in FIG. 8.

The taper angle of the edge cover film 30 smaller than 30 degrees prevents the defective step coverage of the organic EL film 24 at the edge of the window 32, thereby preventing a short-circuit failure between the transparent electrode 22 and the aluminum cathode 26. It is difficult however to reduce the taper angle around 20 degrees in the structure of the present embodiment.

EXAMPLES

Samples including the embodiments as described above and the conventional organic EL device were manufactured, wherein the taper angle of the edge of the edge cover film 30 adjacent to the window 32 is selected at 20, 30, 50, 70 and 90 degrees for each 20 samples. The resultant samples were then subjected to investigations as to whether or not each sample had a short-circuit failure between the aluminum cathode and the transparent electrode. The results of the investigations are shown in table 1 wherein the number of defective devices and the percentage of the non-defective devices are shown for each taper angle of the samples. It is to be noted that the samples having a taper angle of 90 degrees were not subjected to the taper processing using a post-baking treatment.

TABLE 1

| Taper Angle (degrees) | Number of Defective Devices | Percentage of Non-Defective Devices |
|---|---|---|
| 90 | 20 | 0% |
| 70 | 20 | 0% |
| 50 | 10 | 50% |
| 30 | 2 | 90% |
| 20 | 1 | 95% |

It will be confirmed from table 1 that a taper angle equal to or below 30 degrees prevents a short-circuit failure between the aluminum cathode and the transparent electrode, and a taper angle equal to or below 20 degrees is more preferable to obtain this advantage.

In the present invention, the step alleviating film 50 should underlie the layer structure of the organic El element including organic EL film 24 and associated electrodes 22 and 26, and may be formed overlying the $SiO_2$ underlying film 60. In view of the fabrication steps, the step alleviation film 50 should be formed on the SiO$_2$ underlying film 60.

The step alleviating film 50 should be preferably made of an inorganic substance. However, if the step alleviating film 50 is covered entirely by an inter-layer dielectric film to achieve a condition for suppressing the degassing therefrom during subsequent steps, the step alleviating film 50 may be made of an organic substance.

The area for the organic EL display element 40 includes at least one organic film interposed between a pair of electrodes, and may have the structure of anode/luminescence film/cathode, anode/hole transport film/luminescence film/electron transport film/cathode, anode/hole transport film/luminescence film/electron transport film/cathode, anode/hole transport film/luminescence film/cathode, or anode/luminescence film/electron transport film/cathode, for example. These electrodes and organic film(s) can be made of known substances.

Since the above embodiments are described only for examples, the present invention is not limited to the above embodiments and various modifications or alterations can be easily made therefrom by those skilled in the art without departing from the scope of the present invention.

What is claimed is:

1. An organic electroluminescence (EL) display unit comprising:
   an insulating substrate having a first surface;
   plural pixels on the first surface, each of the pixels including a non-light emitting area and a light emitting area, the first surface having a step between the light emitting area and at least a portion of non-light emitting area, and the first surface in the light emitting area being higher than in the at least a portion of non-light emitting area;
   an organic EL element in the light emitting area and a TFT in the non-light emitting area; and
   an edge cover film over the non-light emitting area and having a window exposing the organic EL element, the edge cover film having a taper at an edge adjacent to the window, the step having a height so that an angle of the taper is equal to or smaller than about 30°,
   wherein the substrate includes a flat base whose surface defines the first surface in the non-light emitting area and a step alleviation film on the flat base that defines the first surface in the light emitting area and the step; and
   wherein the TFT includes a gate insulation film and wherein the gate insulation film extends into the luminescence area and is directly on the first surface of the step alleviation film and on a sidewall of the step.

2. The display unit of claim 1, wherein the step alleviation film comprises one of silicon dioxide and silicon nitride.

3. The display unit of claim 1, wherein the angle of the taper is equal to or smaller than about 20°.

4. The display unit of claim 1, wherein the substrate has a depression therein whose edge defines the step and wherein the at least a portion of non-light emitting area is in the depression.

5. An organic electroluminescence (EL) display unit comprising:
   plural pixels on an insulating substrate, each of the pixels including non-light emitting area and a light emitting area;
   an organic EL element in the light emitting area and a TFT on the substrate in the non-light emitting area;
   an edge cover film over the non-light emitting area and having a window exposing the organic EL element,
   the edge cover film having a taper at an edge adjacent to the window,
   wherein a first portion of the substrate includes the organic EL element and extends beyond an edge of the organic EL element when viewed in plan view, the first portion being higher than a second portion of the substrate having at least a portion of non-light emitting area thereon, and the first portion having a height so that an angle of the taper is equal to or smaller than about 30°,
   wherein the substrate includes a flat base, whose surface defines the second portion, and a step alleviation film on the flat base whose surface defines the first portion; and
   wherein the TFT includes a gate insulation film and wherein the gate insulation film extends into the luminescence area directly on the step alleviation film.

6. The display unit of claim 5, wherein the substrate comprises silicon dioxide and the step alleviation film comprises one of silicon dioxide and silicon nitride.

7. The display unit of claim 5, wherein the step alleviation film is only in the luminescence area.

8. The display unit of claim 5, wherein the angle of the taper is equal to or smaller than about 20°.

9. The display unit of claim 5, wherein the substrate has a depression therein that defines the second portion and wherein the at least a portion of non-light emitting area is in the depression.

* * * * *